United States Patent [19]

Takiguchi et al.

[11] Patent Number: 4,803,690
[45] Date of Patent: Feb. 7, 1989

[54] SEMICONDUCTOR LASER

[75] Inventors: Haruhisa Takiguchi; Shinji Kaneiwa, both of Nara; Toshihiko Yoshida; Sadayoshi Matsui, both of Tenri, all of Japan

[73] Assignee: Sharp Kabushiki Kaisha, Osaka, Japan

[21] Appl. No.: 839,869

[22] Filed: Mar. 13, 1986

[30] Foreign Application Priority Data

Mar. 15, 1985 [JP] Japan .................................. 60-52606

[51] Int. Cl.$^4$ ........................ H01S 3/19; H01S 3/08
[52] U.S. Cl. ...................................... 372/45; 372/96; 372/102
[58] Field of Search ..................... 372/96, 102, 44, 46, 372/45

[56] References Cited

U.S. PATENT DOCUMENTS 4,178,604  12/1979  Nakamura et al. ................... 372/96

FOREIGN PATENT DOCUMENTS 2447536  10/1974  Fed. Rep. of Germany .
2537093  8/1975   Fed. Rep. of Germany .
2151402  7/1985   United Kingdom .

OTHER PUBLICATIONS

Patent Abstracts of Japan, vol. 6, No. 72 (E-105) (950), May 7, 1982; & JP-A-57 12 585 (Nippon Denki K.K.) 22-01-1982.

Primary Examiner—William L. Sikes
Assistant Examiner—Georgia Y. Epps
Attorney, Agent, or Firm—Ciotti & Murashige, Irell & Manella

[57] ABSTRACT

A semiconductor laser comprising a triple-layered structure composed of an active layer for laser oscillation and a pair of optical guiding layers sandwiching said active layer therebetween, wherein the refractive index of each of said optical guiding layers is smaller than that of said active layer, and the bandgap of each of said optical guiding layers is greater than that of said active layer, and moreover diffraction gratings with different pitches are positioned on the outer side of each of said optical guiding layers.

2 Claims, 3 Drawing Sheets

FIG. 2.(A)
FIG. 2(B)
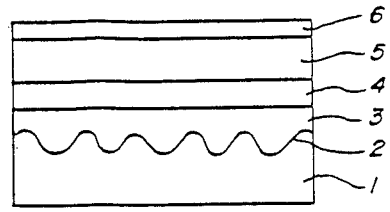
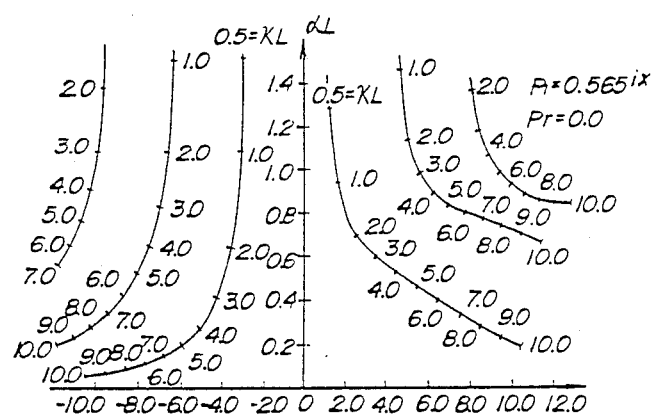
FIG. 3

SEMICONDUCTOR LASER

BACKGROUND OF THE INVENTION

1. Field of the invention:

This invention relates to a semiconductor laser which has diffraction gratings therein allowing the selection of a wavelength. More particularly, it relates to a GaInAsP/InP distributed feedback semiconductor laser which is useful as a light source in optical communication systems.

2. Description of the prior art:

Since GaInAsP/InP double-heterostructure semiconductor lasers having an InP substrate attain laser oscillation at a wavelength ranging from 1.0 to 1.6 μm, they are useful as a light source in optical communication systems incorporating optical fibers. Especially, distributed feedback semiconductor lasers (DFB lasers) which have a diffraction grating with a periodic corrugation on or near the active regon attain laser-oscillation operation at a single wavelength even when the oscillation wavelength is being modulated, and accordingly they are optimal as a light source for future optical communications sytems. DFB lasers are fabricated as follows: As shown in FIG. 2(A), on the surface of an n-InP substrate 1, a diffraction grating 2 is formed, first. Then, on the side of the diffraction grating 2 of the InP substrate 1, an n-GaInAsP optical guiding layer 3, a GaInAsP active layer 4, a p-InP cladding layer 5 and a p-GaInAsP cap layer 6 are successively grown by liquid phase epitaxy, resulting in the DFB semiconductor laser having a double-heterostructure multi-layered crystal for laser oscillation as shown in FIG. 2(B). The bandgap energy of the optical guiding layer 3 is greater than that of the active layer 4, so that light can be propagated into a region extending from the active layer 4 to the optical guiding layer 3. On the other hand, carriers injected into the semiconductor laser are confined within the active layer 4. That is, the above-mentioned DFB semiconductor laser has a socalled SCH (separate confinement heterostructure) structure. This DFB semiconductor laser is disadvantageous in that the Fabry-Pérot resonantor which is constituted by both facets resulting from the cleavage of the wafer produced by the above-mentioned process, achieves laser oscillation not only in the DFB mode but also in the F-P mode so that the laser oscillation becomes unstable. In order to prevent laser oscillation in the F-P mode, one of the facets is slanted in the resonance direction by means of a slanting means. Moreover, the above-mentioned DFB semiconductor laser is disadvantageous in that even though the sloped facet is formed to prevent the reflection of light therefrom to thereby suppress the laser oscillation in the F-P mode, there is a possibility of laser oscillation in two DFB modes depending upon the reflectivity of the other facet and the phase of laser light therefrom since the other facet has an influence on the DFB mode. The threshold gain $\alpha$ of laser oscillation in the DFB mode with the reflection of light from the other facet of the resonator is represented as follows:

$$(\tau L)^2 + (\kappa L)^2 \sin h^2 (\tau L)(1 - Rl) + 2i\kappa L R l \tau L \sin h(\tau L) \cos h (\tau L) = 0$$

$$\tau = (\alpha - i\Delta\beta)^2 + \kappa^2$$

wherein L is the length of the laser device, $\kappa$ is the coupling coefficient, Rl is the reflectivity of the facet which is $0.565 \exp(i\theta)$ (wherein $\theta = \pi$), and $\Delta\beta$ is the deviation of a propagation constant from the Bragg wavelength.

FIG. 3 shows the dependence of $\alpha L$ on $\alpha\beta L$ which are obtainable from the above-mentioned equations. Given that $\kappa$ is 40 cm$^{-1}$ and L is 500 μm, $\kappa L$ is 2.0 and these two modes have the same threshold gain in both side of the Bragg wavelength, resulting in laser oscillation in the two modes, the spectra of which is shown in FIG. 4, indicating that when laser oscillation is achieved in the two modes, laser oscillation in a single longitudinal mode cannot be obtained notwithstanding that the purpose of use of such a DFB laser is to obtain laser oscillation in a single longitudinal mode.

As mentioned above, depending upon the combination of the reflectivity of a facet of DFB lasers, the phase of laser light therefrom and the coupling coefficient thereof, DFB lasers do not oscillate in a single longitudinal mode.

SUMMARY OF THE INVENTION

The semiconductor laser of this invention which overcomes the above-discussed and numerous other disadvantages and deficiencies of the prior art, comprises a triple-layered structure composed of an active layer for laser oscillation and a pair of optical guiding layers sandwiching said active layer therebetween, wherein the refractive index of each of said optical guiding layers is smaller than that of said active layer, and the bandgap of each of said optical guiding layers is greater than that of said active layer, and moreover diffraction gratings with different pitches are positioned on the outer side of each of said optical guiding layers.

The pitches of said diffraction gratings are, in a preferred embodiment, set such that the oscillation wavelength, which is in a longer wavelength region than the Bragg wavelength corresponding to the pitch of one of said diffraction gratings and at which the minimum threshold gain of laser oscillation can be achieved, is the same as the oscillation wavelength which is in a shorter wavelength region than the Bragg wavelength corresponding to the pitch of the other of said diffraction gratings and at which the minimum threshold gain of laser oscillation can be achieved.

Thus, the invention described herein makes possible the object of (1) providing a DFB laser which attains stabilized laser oscillation in a single mode despite the reflectivity of the facets thereof, the phase of laser light therefrom and the coupling coefficient thereof; and (2) providing a DFB laser which attains laser oscillation at a well-regulated oscillation wavelength.

BRIEF DESCRIPTION OF THE DRAWINGS

This invention may be better understood and its numerous objects and advantages will become apparent to those skilled in the art by reference to the accompanying drawings as follows:

FIGS. 2(A) and 2(B) are schematic diagrams showing the fabrication process of a conventional DFB laser.

FIG. 3 is a graph showing the dependence of $\alpha L$ on $\Delta\beta L$ (wherein $\Delta\beta$ is the deviation of a propagation constant from the Bragg wavelength) of a conventional DFB laser fabricated by the process shown in FIGS. 2(A) and 2(B).

DESCRIPTION OF THE PREFERRED EMBODIMENTS

The DFB laser of this invention comprises a pair of optical guiding layers sandwiching the active layer for laser oscillation therebetween. On both optical guiding layers, diffraction gratings which are different in the pitch from each other are formed, respectively, resulting in a single oscillation mode in the minimum threshold gain of laser oscillation despite the reflectivity of the facets thereof, the phase of laser light therefrom and the coupling coefficient thereof, so that the resulting DFB laser can attain stabilized laser oscillation in a single mode.

EXAMPLE

Figure 1:
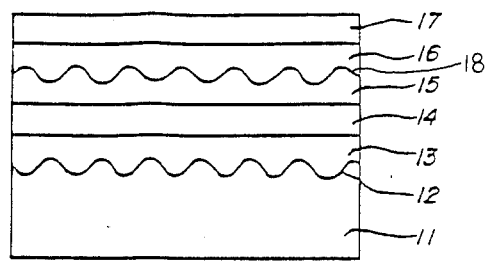
FIG. 1(A) is a cross sectional view showing a DFB laser of this invention.
FIG. 1(B) is a graph showing the dependence of $\alpha L$ (wherein $\alpha$ is the gain for the beginning of laser oscillation in the DFB mode, and L is the length of the laser device) on the wavelength of the DFB laser shown in FIG. 1(A).
Figure 1:
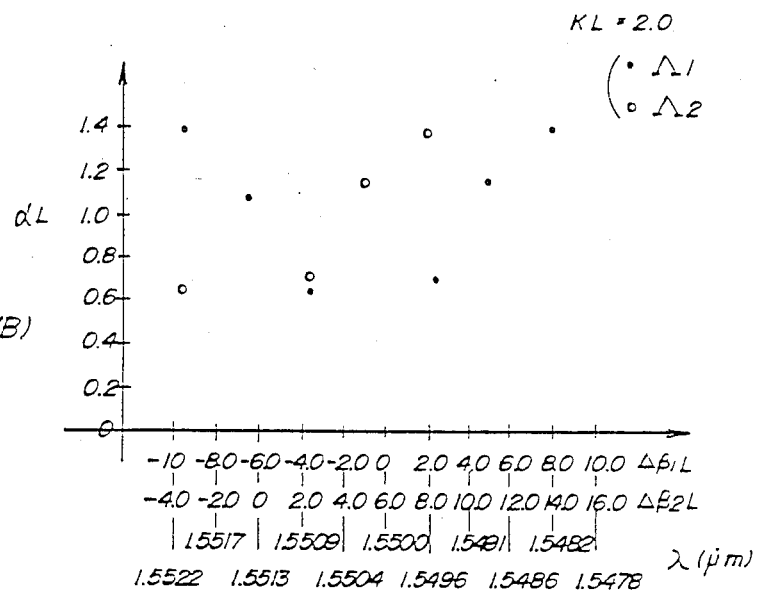
Figure 4:
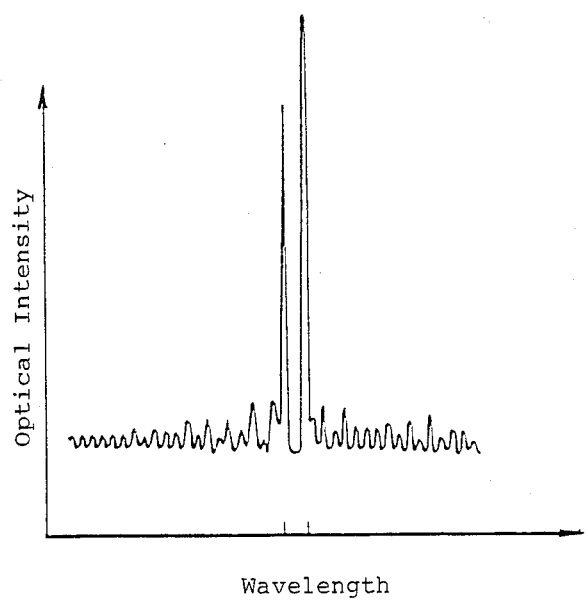
FIG. 4 is a graph showing the spectrum characteristics of a conventional DFB laser which oscillates in two modes.

FIG. 1(A) shows a DFB laser of this invention and FIG. 1(B) shows the dependence of $\alpha L$ on the wavelength of the DFB laser shown in FIG. 1(A).

The DFB laser is produced as follows: On the (011) face of an n-InP substrate 11, a diffraction grating 12 with the pitch $\Lambda_1$ is formed, first. Then, on the side of the diffraction grating 12 of the substrate 11, an n-GaInAsP optical guiding layer 13, a non-doped GaInAsP active layer 14 and a p-GaInAsP optical guiding layer 15 are successively grown by an epitaxial growth technique, resulting in a triple-layered structure in which the active layer 14 for laser oscillation is sandwiched between the n-optical guiding layer 13 and the p-optical guiding layer 15. Then, a diffraction grating 18 with the pitch $\Lambda_2$ (wherein $\Lambda_2 > \Lambda_1$) is formed on the surface of the p-optical guiding layer 15, followed by successively growing a p-InP cladding layer 16 and a p-GaInAsP cap layer 17 by an epitaxial growth technique, resulting in a wafer having a double-heterostructure multi-layered crystal for laser oscillation. The composition ratio of the mixed crystal is set in such a manner that the refractive index of each of the optical guiding layers 13 and 15 which sandwich the active layer 14 therebetween becomes smaller than that of the active layer 14, but the bandgap of each of them becomes greater than that of the active layer 14.

The reason why the diffraction gratings with different pitches $\Lambda_1$ and $\Lambda_2$ are formed is as follows:

Suppose that a DFB laser having only one diffraction grating with the pitch $\Lambda_1$ instead of the DFB laser shown in FIG. 1(A) is produced with a coupling coefficient $\chi$ of 40 cm$^{-1}$ and a resonance length L of 500 $\mu$m, and moreover that the pitch $\Lambda_1$ of the diffraction grating is represented by the following equation under the Bragg reflection conditions:

$$\Lambda_1 = \frac{\lambda_{b1}}{2n_{eq}} = \frac{1.55 \mu m}{2 \times 3.50} = 0.2214 \mu m$$
$$= 2214 \text{Å}$$

wherein $\lambda_{b1}$ is the oscillation wavelength which is 1.55 $\mu$m, and $n_{eq}$ is the equivalent refractive index which is 3.50.

Moreover, suppose that the quaternary alloy crystal of the active layer 14 is $In_{0.65}Ga_{0.35}As_{0.79}P_{0.21}$ so as to allow correspondence to the oscillation wavelength $\lambda_{b1}$.

In this supposed DFB laser, wherein $\chi L = 2.0$ since $\chi = 40$ cm$^{-1}$ and L=500 $\mu$m, it can be seen from FIG. 3 that there are threshold gains of laser oscillation which nearly correspond to the case where $\Delta\beta L \simeq 4.0$ and $\Delta\beta L \simeq 2.0$. Thus, in this laser device, $\Delta\beta_1$ is presented by the following equation:

$$\Delta \beta_1 = \beta_1 - \beta_{b1} = 2\pi n_{eq} \left( \frac{1}{\lambda_1} - \frac{1}{\lambda_{b1}} \right)$$
$$\simeq 2\pi n_{eq} \frac{\lambda_{b1} - \lambda_1}{\lambda_{b1}^2}$$

wherein $\beta_{b1}$ is the propagation constant, $\lambda_{b1}$ is the Bragg wavelength at the pitch $\Lambda_1$ and $\lambda_1$ is the wavelength which is in a longer wavelength region than the Bragg wavelength $\lambda_{b1}$ and at which the minimum threshold gain of laser oscillation can be achieved.

When $\Delta\beta_1 \cdot L = -4$, $\lambda_{b1} = 1.55$ $\mu$m, $n_{eq} = 3.50$ and L=500 $\mu$m are substituted in the above-mentioned equation, $\lambda_1$ is obtained as follows:

$$\lambda_1 = \lambda_{b1} - \frac{\lambda_{b1}^2}{L \cdot 2\pi n_{eq}} \times (-4) = 1.5509 \mu m$$

When $\Delta\beta_1 \cdot L = 2$, $\lambda_1'$ is obtained as follows:

$$\lambda_1' = \lambda_{b1} - \frac{\lambda_{b1}^2}{L \cdot 2\pi n_{eq}} \times (2) = 1.5496 \mu m$$

wherein $\lambda_1'$ is the wavelength which is in a shorter wavelength region than the Bragg wavelength $\lambda_{b1}$ and at which the minimum threshold gain of laser oscillation can be achieved.

Therefore, this DFB laser will oscillate at two different wavelengths which are at a distance of 13 Å (i.e., $\lambda_1 - \lambda_1' = 13$ Å) from each other.

Alternatively, suppose that a DFB laser having only one diffraction grating with the pitch $\Lambda_2$ is produced. The values $\lambda_2$ and $\lambda_2'$ which correspond to the above-mentioned values $\lambda_1$ and $\lambda_1'$, respectively are presented as follows:

$$\lambda_2 = \lambda_{b2} - \frac{\lambda_{b2}^2}{L \cdot 2\pi n_{eq}} \times (-4)$$

$$\lambda_2' = \lambda_{b2} - \frac{\lambda_{b2}^2}{L \cdot 2\pi n_{eq}} \times (2)$$

wherein $\lambda_2$ is the wavelength which is in a longer wavelength region than the Bragg wavelength length $\lambda_{b2}$ at the pitch $\Lambda_2$ and at which the minimum threshold gain of laser oscillation can be achieved, and $\lambda_2'$ is the wavelength which is in a shorter wavelength region than the Bragg wavelength $\lambda_{b2}$ and at which the minimum threshold gain of laser oscillation can be achieved.

On the other hand, the pitches $\Lambda_1$ and $\Lambda_2$ of the two diffraction gratings of the DFB laser shown in FIG. 1(A) are set in such a manner that the wavelength $\lambda_1$ at the pitch $\Lambda_1$ is equal to the wavelength $\lambda_2'$ at the pitch $\Lambda_2$, resulting in the following equation:

$$\lambda_{b1} - \frac{\lambda_{b1}^2}{L \cdot 2\pi n_{eq}} \times (-4) = \lambda_{b2} - \frac{\lambda_{b2}^2}{L \cdot 2\pi n_{eq}} \times (2)$$

Since $\Lambda_1$ and $\Lambda_2$ are represented by the following equations, if the values $\lambda_{b1}$ and $\lambda_{b2}$ are determined, both $\Lambda_1$ and $\Lambda_2$ can be obtained:

$$\Lambda_1 = \frac{\lambda_{b1}}{2n_{eq}}$$

$$\Lambda_2 = \frac{\lambda_{b2}}{2n_{eq}}$$

When $\Lambda_1$ and $\Lambda_2$ are obtained in the above-mentioned manner, the relationships between $\Delta\beta_1 L$ and $\alpha L$ and between $\Delta\beta_2 L$ and $\alpha L$ are represented such as those shown in FIG. 1(B), wherein the wavelengths corresponding to $\Delta\beta_1 L$ and $\Delta\beta_2 L$, respectively, are indicated. The values of $\Delta\beta_1 L$, $\Delta\beta_2 L$ and $\alpha L$ are set depending upon each of the diffraction gratings with the pitches $\Lambda_1$ and $\Lambda_2$. The dependence of $\alpha L$ on the wavelength of the DFB laser shown in FIG. 1(A) can be assumed to be approximately the average dependence of $\alpha L$ on the wavelength with respect to $\Lambda_1$ and $\Lambda_2$ shown in FIG. 1(B). Thus, in the DFB laser shown in FIG. 1(A), it can be seen from FIG. 1(B) that when $\Lambda = 1.5509$ μm, the minimum threshold gain of laser oscillation is attained and moreover the minimum gain is sufficiently smaller than those of laser oscillation at other wavelengths, resultin in a stabilized single oscillation spectrum.

Although the above-mentioned example discloses the case in which the reflection of light arises from one of the two facets and the phase of light is $\pi$, it is not limited thereto. According to detailed calculations by the inventors, when $\Lambda_1$ and $\Lambda_2$ are varied to the same extent, the wavelength which provides the minimum gain is unequivocally determined despite the reflectivity of the facets and the phase of the light, so that laser oscillation in a single longitudinal mode can be attained. Moreover, semiconductor laser materials used in this invention are not limited to the GaInAsP/InP system, but other materials can be employed. This invention is, of course, applicable to distributed Bragg reflection lasers (DBR lasers) other than distributed feedback lasers (DFB lasers).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In a semiconductor layer comprising a substrate and a multilayer structure formed on said substrate, said multilayer structure comprising at least a triple-layered structure composed of an active layer for layer oscillation, a pair of optical guiding layers sandwiching said active layer therebetween, and diffraction gratings positioned on the outer side of each of said optical guiding layers, each of said diffraction gratings having a different pitch, the refractive index of each of said optical guiding layers being smaller than that of said active layer, and the bandgap of each of said optical guiding layers being greater than that of said active layer.

2. A semiconductor laser according to claim 1, wherein the pitches of said diffraction gratings are set such that the oscillation wavelength, which is in a longer wavelength region than the Bragg wavelength corresponding to the pitch of one of said diffraction gratings and at which the minimum threshold gain of laser oscillation can be achieved, is the same as the oscillation wavelength which is in a shorter wavelength region than the Bragg wavelength corresponding to the pitch of the other of said diffraction gratings and at which the minimum threshold gain of laser oscillation can be achieved.

* * * * *